(12) United States Patent
Daikoku

(10) Patent No.: US 11,624,499 B2
(45) Date of Patent: Apr. 11, 2023

(54) PLANAR LIGHT SOURCE

(71) Applicant: NICHIA CORPORATION, Anan (JP)

(72) Inventor: Shinichi Daikoku, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/533,922

(22) Filed: Nov. 23, 2021

(65) Prior Publication Data
US 2022/0170619 A1 Jun. 2, 2022

(30) Foreign Application Priority Data
Nov. 30, 2020 (JP) .............................. JP2020-198495

(51) Int. Cl.
*F21V 23/00* (2015.01)
*F21Y 115/10* (2016.01)

(52) U.S. Cl.
CPC .......... *F21V 23/005* (2013.01); *F21V 23/002* (2013.01); *F21Y 2115/10* (2016.08)

(58) Field of Classification Search
CPC ....... F21V 23/002–005; F21Y 2115/10; G02B 6/00; H01L 33/38; H01L 33/486; H01L 33/58; H01L 33/60; H01L 33/62
See application file for complete search history.

(56) References Cited

U.S. PATENT DOCUMENTS

| 8,592,857 B2 * | 11/2013 | Chan ....................... H01L 33/52 |
| | | 257/E33.059 |
| 2011/0149594 A1 | 6/2011 | Terajima et al. |
| 2019/0275925 A1 | 9/2019 | Chen et al. |
| 2021/0013388 A1 | 1/2021 | Zhong et al. |

FOREIGN PATENT DOCUMENTS

| JP | H04-269841 A | 9/1992 |
| JP | 2005-129726 A | 5/2005 |
| JP | 2006-024721 A | 1/2006 |
| JP | 2010-008837 A | 1/2010 |
| JP | 2011-181655 A | 9/2011 |
| JP | 2011-210674 A | 10/2011 |
| JP | 2012-248573 A | 12/2012 |
| JP | 2019-160770 A | 9/2019 |
| WO | WO-2019/179227 A1 | 9/2019 |

* cited by examiner

*Primary Examiner* — Jason M Han
(74) *Attorney, Agent, or Firm* — Foley & Lardner LLP

(57) ABSTRACT

A planar light source includes: a support member that defines a plurality of first holes extending from an upper surface to a lower surface of the support member, wherein the support member comprises a wiring layer disposed at a lower surface side; a light source disposed on the upper surface of the support member, the light source including: a light-emitting element, and a plurality of electrodes disposed on a lower surface of the light-emitting element; and a plurality of conductive members, each of which is disposed in a corresponding one of the first holes and electrically connects a corresponding one of the electrodes and the wiring layer. A lower surface of each of the electrodes is located in the corresponding first hole. Each of the conductive members is in contact with the lower surface and lateral surfaces of the corresponding electrode.

17 Claims, 10 Drawing Sheets

PLANAR LIGHT SOURCE

CROSS-REFERENCE TO RELATED APPLICATION

This application claims priority to Japanese Patent Application No. 2020-198495, filed on Nov. 30, 2020, the disclosure of which is hereby incorporated by reference in its entirety.

BACKGROUND

The present disclosure relates to a planar light source.

A light-emitting module in which a light-emitting element such as a light-emitting diode and a light guide member are combined is widely used in, for example, a planar light source such as a backlight for a liquid crystal display. For example, in a planar light source disclosed in JP-A-2010-8837, a light source is disposed on a wiring substrate (for example, a flexible printed substrate) to be electrically connected to an external circuit.

SUMMARY

An object of certain embodiments of the invention is to provide a planar light source in which the reliability of an electrical connection between a light source and a wiring layer can be improved.

According to one embodiment of the present invention, a planar light source includes a support member including a first upper surface and a first lower surface opposite to the first upper surface, and defining first holes extending through the first upper surface and the first lower surface, and a wiring layer disposed on a first lower surface side; a light source disposed on the first upper surface of the support member, the light source including a light-emitting element including a second upper surface and a second lower surface opposite to the second upper surface, and electrodes disposed on the second lower surface; and conductive members each disposed in a corresponding one of the first holes and each electrically connecting corresponding one of the electrodes and the wiring layer. A lower surface of each of the electrodes is located in a corresponding one of the first holes below the first upper surface of the support member. Each of the conductive members is in contact with the lower surface and lateral surfaces of the corresponding one of the electrodes.

According to certain embodiments of the invention, the reliability of an electrical connection between a light source and a wiring layer can be improved.

DETAILED DESCRIPTION

Figure 1:
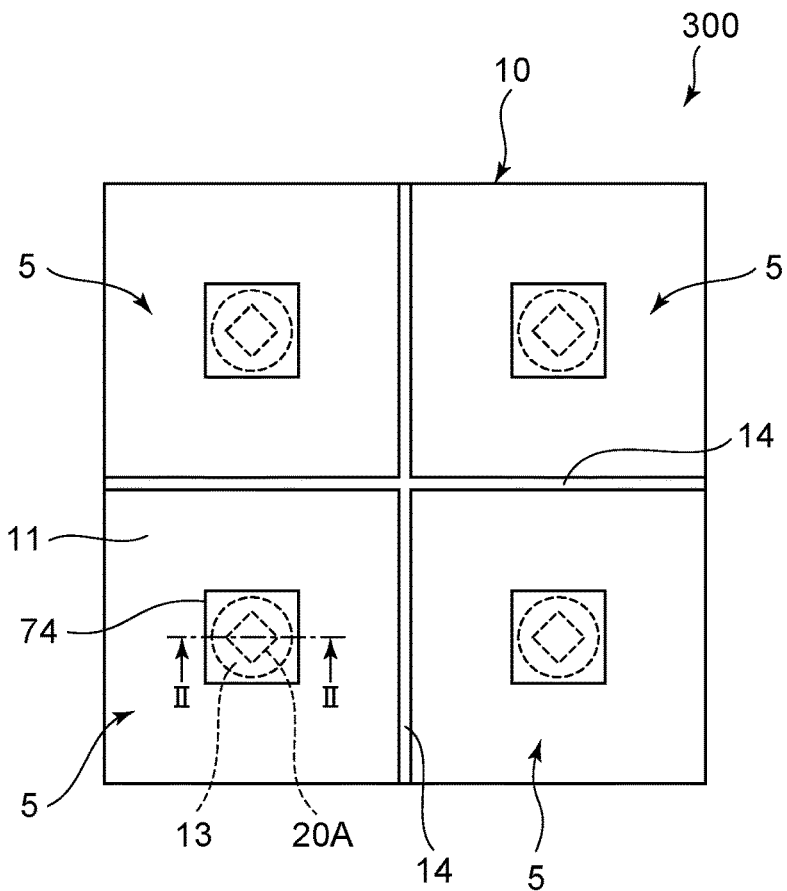
FIG. 1 is a schematic top view of a planar light source of one embodiment of the invention.

Hereinafter, embodiments will be described with reference to the drawings. The drawings schematically show certain embodiments. Accordingly, the scale of each member, the intervals or the positional relationships between members, or the like may be exaggerated, and illustration of some members may be omitted. Also, end views showing only cut surfaces may be used as cross-sectional views. In the drawings, the same configuration is denoted by the same reference numeral.

FIG. 1 is a schematic top view of a planar light source 300 of one embodiment of the invention.

Figure 2:
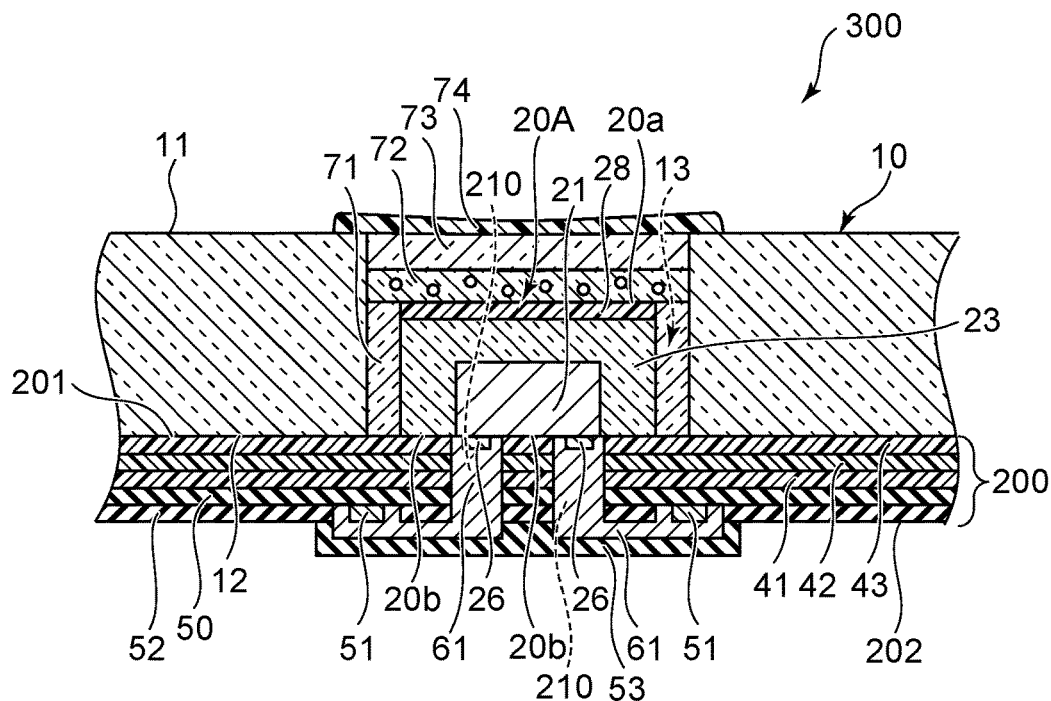
FIG. 2 is a schematic cross-sectional view taken along line II-II in FIG. 1.

FIG. 2 is a schematic cross-sectional view taken along line II-II in FIG. 1.

The planar light source 300 includes a support member 200, light sources 20A, a light guide member 10, and conductive members 61.

The support member 200 includes a first upper surface 201, a first lower surface 202 opposite to the first upper surface 201, first holes 210 extending through the first upper surface 201 and the first lower surface 202, and a wiring substrate 50 disposed on a first lower surface 202 side. Connection portions 51 may be disposed on the first lower surface 202 side of the wiring substrate 50.

Each light source 20A includes a light-emitting element 21, and is disposed on the first upper surface 201 of the support member 200.

Figure 3A:
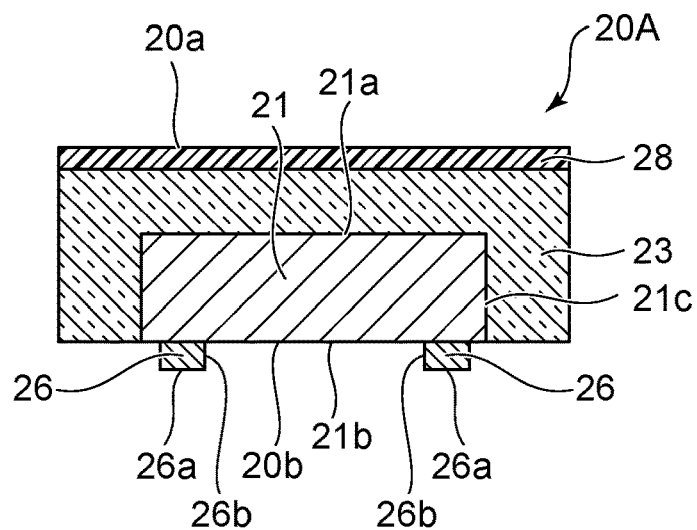
FIG. 3A is a schematic cross-sectional view of a light source of one embodiment of the invention.
Figure 3B:
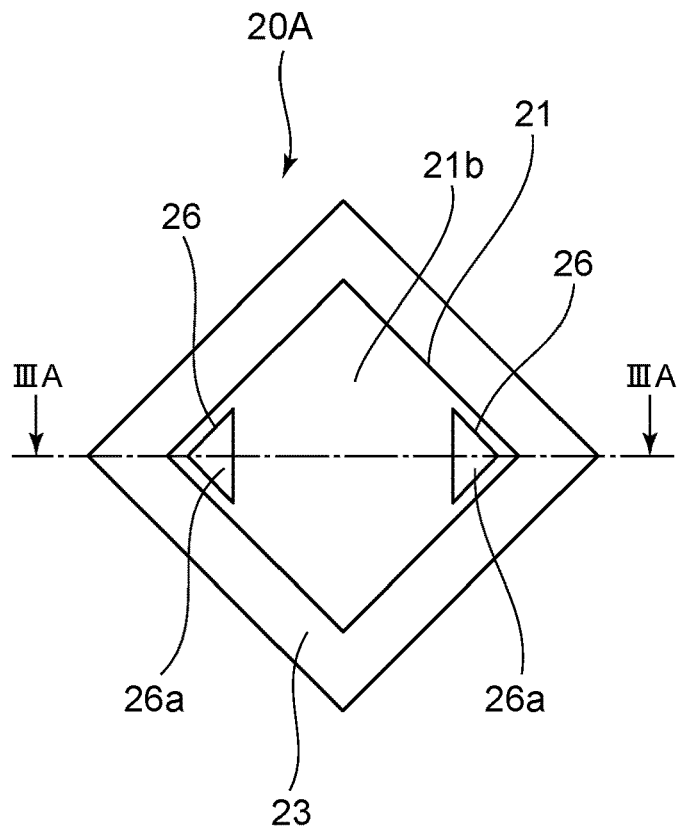
FIG. 3B is a schematic bottom view of the light source shown in FIG. 3A.

FIG. 3A is schematic a cross-sectional view of a light source 20A. FIG. 3B is a schematic bottom view of the light source 20A shown in FIG. 3A. FIG. 3A is a schematic cross-sectional view taken along line IIIA-IIIA in FIG. 3B.

The light source 20A includes the light-emitting element 21, electrodes 26, and a first light-transmissive member 23.

The light-emitting element 21 includes a second upper surface 21a, a second lower surface 21b opposite to the second upper surface 21a, and a second lateral surface 21c between the second upper surface 21a and the second lower surface 21b.

The light-emitting element 21 includes a semiconductor stacked body. The semiconductor stacked body includes, for example, a support substrate such as sapphire or gallium nitride, an n-type semiconductor layer and a p-type semiconductor layer that are disposed on the support substrate, a light-emitting layer disposed between the n-type semiconductor layer and the p-type semiconductor layer, and an n-side electrode and a p-side electrode that are connected electrically to the n-type semiconductor layer and the p-type semiconductor layer, respectively. A semiconductor stacked body that does not include the support substrate may be used.

The structure of the light-emitting layer may be a structure including a single active layer such as a double heterostructure or a single quantum well structure (SQW), or a structure including a plurality of active layers such as a multiple quantum well structure (MQW). The light-emitting layer is configured to emit visible light or ultraviolet light.

The light-emitting layer can be configured to emit visible light in a range of blue to red. Examples of the semiconductor stacked body including such a light-emitting layer include $In_xAl_yGa_{1-x-y}N$ ($0 \leq x$, $0 \leq y$, $x+y \leq 1$).

The semiconductor stacked body can include at least one light-emitting layer configured to emit light of emission color described above. For example, the semiconductor stacked body may have a structure including at least one light-emitting layer between the n-type semiconductor layer and the p-type semiconductor layer, or may have a structure in which the n-type semiconductor layer, the light-emitting layer and the p-type semiconductor layer, layered in order, are repeated multiple times. When the semiconductor stacked body includes a plurality of light-emitting layers, the semiconductor stacked body may include light-emitting layers of different emission colors, or may include light-emitting layers of the same emission color. The expression that the emission colors are the same means that the main wavelength may have a variation in a range in which the emission colors can be regarded as being the same in use, for example, a variation of approximately several nanometers. A combination of emission colors can be appropriately selected. For example, when the semiconductor stacked body includes two light-emitting layers, examples of a combination of emission colors include blue light and blue light, green light and green light, red light and red light, ultraviolet light and ultraviolet light, blue light and green light, blue light and red light, green light and red light, and the like. Also, the light-emitting layer may include a plurality of active layers of different emission colors, or may include a plurality of active layers of the same emission color.

Positive and negative electrodes 26 that are electrically connected to the p-side electrode and the n-side electrode of the light-emitting element 21, respectively, are disposed on the second lower surface 21b of the light-emitting element 21.

The first light-transmissive member 23 is disposed on the second upper surface 21a and the second lateral surface 21c of the light-emitting element 21, and covers the second upper surface 21a and the second lateral surface 21c. The second lower surface 21b of the light-emitting element 21 is exposed from the first light-transmissive member 23. A lower surface of the first light-transmissive member 23 forms, together with the second lower surface 21b of the light-emitting element 21, a lower surface 20b of the light source 20A.

The first light-transmissive member 23 protects the light-emitting element 21, and functions to convert wavelength, diffuse light, etc., depending on particles added to the first light-transmissive member 23. More specifically, the first light-transmissive member 23 contains a light-transmissive resin, and may further contain a phosphor. Examples of the light-transmissive resin include silicone resins, phenol resins, epoxy resins, acrylic resins, and the like. For the phosphor, yttrium aluminum garnet-based phosphors (for example, $Y_3(Al,Ga)_5O_{12}:Ce$), lutetium aluminum garnet-based phosphors (for example, $Lu_3(Al,Ga)_5O_{12}:Ce$), terbium aluminum garnet-based phosphors (for example, $Tb_3(Al,Ga)_5O_{12}:Ce$), nitride-based phosphors such as β-sialon phosphors (for example, $(Si,Al)_3(O,N)_4:Eu$), α-sialon phosphors (for example, $Mz(Si,Al)_{12}(O,N)_{16}$ (where $0<z\leq2$ and M is a lanthanide element excluding Li, Mg, Ca, Y, La, and Ce)), CASN-based phosphors (for example, $CaAlSiN_3:Eu$), or SCASN-based phosphors (for example, $(Sr,Ca)AlSiN_3:Eu$), fluoride-based phosphors such as KSF-based phosphors (for example, $K_2SiF_6:Mn$) or MGF-based phosphors (for example, $3.5MgO.0.5MgF_2.GeO_2:Mn$), quantum dot phosphors, etc., can be used. For the phosphor to be added to the first light-transmissive member 23, one type of phosphor may be used, or a plurality of types of phosphors may be used.

A lower surface 26a and a lateral surface 26b of the electrode 26 are not covered by the first light-transmissive member 23, but are exposed from the first light-transmissive member 23. For example, Cu may be used for a material of the electrode 26. As shown in FIG. 3B, the lower surface 26a of the electrode 26 has, for example, a triangular shape. In addition, the lower surface 26a of the electrode 26 may have a circular shape, an elliptical shape, or a polygonal shape such as a quadrilateral shape.

The light source 20A can include a first light adjustment member 28, depending on a desired light distribution. The first light adjustment member 28 is disposed on an upper surface of the first light-transmissive member 23, and forms an upper surface 20a of the light source 20A. Alternatively, the first light adjustment member 28 is not disposed on the first light-transmissive member 23; in other words, the upper surface of the first light-transmissive member 23 can form the upper surface 20a of the light source 20A.

The first light adjustment member 28 is adapted to control the amount or an emitting direction of light to be emitted from the upper surface of the first light-transmissive member 23. The first light adjustment member 28 has reflectivity and light transmissivity to light emitted by the light-emitting element 21 or the phosphor. A portion of light emitted from the upper surface of the first light-transmissive member 23 is reflected at the first light adjustment member 28, and another a portion of the light is transmitted through the first light adjustment member 28. The first light adjustment member 28 has a transmittance, for example, preferably in a range of 1% to 50% and more preferably in a range of 3% to 30%. With such a transmittance, the brightness directly above the light source 20A can be reduced, and unevenness in brightness in a surface of the planar light source 300 can be reduced.

The first light adjustment member 28 can be composed of a light-transmissive resin, a light diffusing agent contained in the light-transmissive resin, and the like. Examples of the light-transmissive resin include silicone resins, phenol resins, epoxy resins, and acrylic resins. Examples of the light diffusing agent include particles of $TiO_2$, $SiO_2$, $Al_2O_3$, ZnO, or glass. Examples of the first light adjustment member 28 include a metal member made of Al, Ag, or the like, and a dielectric multilayer film.

As shown in FIG. 2, the light guide member 10 includes a third upper surface 11, a third lower surface 12 opposite to the third upper surface 11, and a second hole 13 in which the light source 20A is disposed. For example, the second hole 13 is a through-hole extending from the third upper surface 11 to the third lower surface 12. The light guide member 10 is disposed on the support member 200 with the third lower surface 12 facing the first upper surface 201 of the support member 200.

The light guide member 10 has light transmissivity to light to be emitted by the light source 20A. The light to be emitted by the light source 20A includes at least light to be emitted by the light-emitting element 21. When the light source 20A includes the phosphor, the light to be emitted by the light source 20A also includes light to be emitted by the phosphor. The light guide member 10 has a transmittance of, for example, preferably 80% or more and more preferably 90% or more of light from the light source 20A.

Examples of a material of the light guide member 10 include a thermoplastic resin such as an acrylic resin, a polycarbonate resin, a cyclic polyolefin resin, a polyethylene terephthalate resin, or a polyester resin, a thermosetting resin such as an epoxy resin or a silicone resin, or a light guide plate or a light guide sheet made of a glass or the like. Alternatively, an air layer may be provided instead of using the light guide member.

The light guide member 10 preferably has a thickness, for example, in a range of 200 μm to 800 μm. The light guide member 10 may be formed of a single layer in a thickness direction thereof, or may be formed of a stacked body of a plurality of layers. When the light guide member 10 is formed of the stacked body, an adhesive member having light transmissivity may be disposed between adjacent layers. Different types of main materials may be used for a plurality of layers of the stacked body. Examples of a material of the adhesive member include a thermoplastic resin such as an acrylic resin, a polycarbonate resin, a cyclic polyolefin resin, a polyethylene terephthalate resin, or polyester resin, or a thermosetting resin such as an epoxy resin or a silicone resin.

As shown in FIG. 1, the light guide member 10 is demarcated into a plurality light-emitting regions 5 by a demarcation groove 14. The demarcation groove 14 has a grid shape in a plan view, and demarcates the light guide member 10 such that at least one light source 20A is located in a single light-emitting region 5. FIG. 1 shows the planar light source 300 including, for example, four light-emitting regions 5 demarcated in two rows and two columns. Each of the light-emitting regions 5 demarcated by the demarcation groove 14 can serve as, for example, a driving unit for local dimming. The number of the light-emitting regions 5 forming the planar light source 300 may be other than the number of the light-emitting regions 5 illustrated in FIG. 1.

The second hole 13 formed in the light guide member 10 can have, for example, a circular shape in a top view shown in FIG. 1. In addition, in a top view, the second hole 13 can have, for example, an elliptical shape or a polygonal shape such as a triangular shape, a quadrilateral shape, a hexagonal shape, or an octagonal shape.

As shown in FIG. 2, the light source 20A is disposed on the support member 200 in the second hole 13 of the light guide member 10.

The planar light source 300 can further include a second light-transmissive member 71, a wavelength conversion member 72, a third light-transmissive member 73, and a second light adjustment member 74. The second light-transmissive member 71, the wavelength conversion member 72, and the third light-transmissive member 73 are disposed in the second hole 13 of the light guide member 10.

The second light-transmissive member 71 and the third light-transmissive member 73 have light transmissivity to light to be emitted from the light source 20A. For example, a resin that is the same as a material of the light guide member 10 or a resin having a refractive index with a small difference from that of a material of the light guide member 10 can be used for the second light-transmissive member 71 and the third light-transmissive member 73.

The second light-transmissive member 71 is disposed between a lateral surface of the light source 20A and a lateral surface of the second hole 13 of the light guide member 10. It is preferable that the second light-transmissive member 71 is disposed such that a space, such as an air layer, is not formed between the lateral surface of the light source 20A and the second light-transmissive member 71 and between the lateral surface of the second hole 13 and the second light-transmissive member 71. Accordingly, light from the light source 20A can be easily guided to the light guide member 10.

The wavelength conversion member 72 covers the upper surface 20a of the light source 20A. The wavelength conversion member 72 also covers an upper surface of the second light-transmissive member 71. The wavelength conversion member 72 is a light-transmissive resin member containing the phosphor for adjustment in emission color of the light source 20A.

The third light-transmissive member 73 covers an upper surface of the wavelength conversion member 72. An upper surface of the third light-transmissive member 73 can be a flat surface. Alternatively, the upper surface of the third light-transmissive member 73 can be a concave or convex curved surface.

The second light adjustment member 74 is disposed on the third light-transmissive member 73. The second light adjustment member 74 is adapted to reflect and transmit light emitted from the light source 20A. The second light adjustment member 74 can be constituted of a light-transmissive resin, a light diffusing agent contained in the light-transmissive resin, and the like. Examples of the light-transmissive resin include silicone resins, phenol resins, epoxy resins, and acrylic resins. Examples of the light diffusing agent include particles made of $TiO_2$, $SiO_2$, $Al_2O_3$, ZnO, or glass.

The second light adjustment member 74 can be disposed to cover the entirety or a part of the upper surface of the third light-transmissive member 73. In addition, the second light adjustment member 74 can extend on the upper surface of the third light-transmissive member 73 and further extend on the third upper surface 11 of the light guide member 10 around the upper surface of the third light-transmissive member 73.

As shown in FIG. 1, the second light adjustment member 74 is disposed at a position overlapping the light source 20A in a top view. In the example shown in FIG. 1, the second light adjustment member 74 has a quadrilateral shape larger than a quadrilateral shape of the light source 20A in a top view. In a top view, the second light adjustment member 74 can have, for example, a circular shape or a polygonal shape such as a triangular shape, a hexagonal shape, or an octagonal shape.

The second light adjustment member 74 is adapted to reflect a portion of light emitted directly upward from the light source 20A, and transmits the other part of the light. Accordingly, in the third upper surface 11 of the light guide member 10 which serves as a light-emitting surface of the planar light source 300, the brightness of a region directly above the light source 20A can be prevented from being excessively higher than the brightness of the other region. That is, unevenness in brightness of light to be emitted from a single light-emitting region 5 demarcated by the demarcation groove 14 can be reduced.

The second light adjustment member 74 is preferably has a thickness in a range of 0.005 mm to 0.2 mm and further preferably in a range of 0.01 mm to 0.075 mm. In addition, it is preferable that a reflectance of the second light adjustment member 74 is set to be lower than a reflectance of the first light adjustment member 28 of the light source 20A. The reflectance of the second light adjustment member 74 to light from the light source 20A is, for example, preferably in a range of 20% to 90% and further preferably in a range of 30% to 85%.

The third light-transmissive member 73 is disposed between the second light adjustment member 74 and the first light adjustment member 28. The third light-transmissive member 73 has a higher transmittance to light to be emitted from the light source 20A than the first light adjustment member 28 and the second light adjustment member 74. The third light-transmissive member 73 can have a transmittance to light to be emitted from the light source 20A in a range of 2 times to 100 times the transmittance of the first light adjustment member 28 and the transmittance of the second light adjustment member 74 in a range of less than 100%. With such a transmittance, the region directly above the light source 20A is not excessively bright and not excessively dark. Accordingly, unevenness in brightness in a light-emitting surface of each of the light-emitting regions 5 can be reduced.

As shown in FIG. 2, the support member 200 includes the wiring substrate 50, a first adhesive member 41, a light-reflective sheet 42, and a second adhesive member 43. The first adhesive member 41, the light-reflective sheet 42, and the second adhesive member 43 are disposed on the wiring substrate 50 in order.

The first adhesive member 41 is disposed between the wiring substrate 50 and the light-reflective sheet 42, and causes the wiring substrate 50 and the light-reflective sheet 42 to adhere together. The second adhesive member 43 is disposed between the light-reflective sheet 42 and the third lower surface 12 of the light guide member 10, and causes the light-reflective sheet 42 and the light guide member 10 to adhere together. A portion of the second adhesive member 43 is located below the second hole 13, and the light source 20A is disposed on a portion of the second adhesive member 43 in the second hole 13. An upper surface of the second adhesive member 43 forms the first upper surface 201 of the support member 200. The lower surface 20b of the light source 20A is in contact with the upper surface of the second adhesive member 43.

The second adhesive member 43 is transmissive to light to be emitted from the light source 20A. Examples of the first adhesive member 41 and the second adhesive member 43 include epoxy resins, acrylic resins, cyclic polyolefin resins, and the like.

The light-reflective sheet 42 is disposed between the wiring substrate 50 and the third lower surface 12 of the light guide member 10 and between the wiring substrate 50 and the light source 20A. The light-reflective sheet 42 between the wiring substrate 50 and the third lower surface 12 and the light-reflective sheet 42 between the wiring substrate 50 and the light source 20A may be integral or separate.

The light-reflective sheet 42 is reflective to light to be emitted from the light source 20A. For example, a resin member containing a large number of bubbles or a resin member containing a light diffusing agent can be used for the light-reflective sheet 42. Examples of a material of the resin member include polyethylene terephthalate (PET) resins, cyclic polyolefin resins, acrylic resins, silicone resins, urethane resins, epoxy resins, and the like. For the light diffusing agent, for example, $SiO_2$, $CaF_2$, $MgF_2$, $TiO_2$, $Nb_2O_5$, $BaTiO_3$, $Ta_2O_5$, $Zr_2O_3$, ZnO, $Y_2O_3$, $Al_2O_3$, MgO, $BaSO_4$, or the like can be used.

In the planar light source 300, light that is guided into the light guide member 10 and travels toward the third lower surface 12 is reflected at the light-reflective sheet 42 toward the third upper surface 11 serving as the light-emitting surface of the planar light source 300, so that brightness of light to be extracted from the third upper surface 11 can be improved.

In a region between the light-reflective sheet 42 and the third upper surface 11, light from the light source 20A is guided into the light guide member 10 toward the demarcation groove 14 while total reflection between the light-reflective sheet 42 and the third upper surface 11 is repeated. A portion of the light toward the third upper surface 11 is extracted from the third upper surface 11 to the outside of the light guide member 10.

The wiring substrate 50 includes an insulating base member and a wiring layer. The wiring substrate 50 may include two or more wiring layers layered in a thickness direction of the wiring substrate 50. The first adhesive member 41 is disposed on an upper surface of the wiring substrate 50. An insulating film 52 is disposed on a lower surface of the wiring substrate 50, except for a portion of the wiring substrate 50. In other words, a portion of the lower surface of the wiring substrate 50 is exposed from the insulating film 52. A lower surface of the insulating film 52 forms the first lower surface 202 of the support member 200. The support member 200 may include the connection portions 51 of the wiring layer on the first lower surface 202 side.

The conductive members 61 are disposed below the light source 20A. Each conductive member 61 is disposed in a corresponding one of the first holes 210 extending through the first upper surface 201 and the first lower surface 202 of the support member 200, and extends to a corresponding one of the connection portions 51 of the wiring layer on the first lower surface 202 side of the support member 200.

The conductive member 61 is obtained, for example, by curing a conductive paste in which conductive fillers are dispersed in a binder resin. The conductive member 61 can contain metal, such as copper or silver, as the filler. The filler has a granular shape, a flat shape such as a flat thin-slice shape, a thin slice shape, a flake shape, or the like.

Figure 4A:
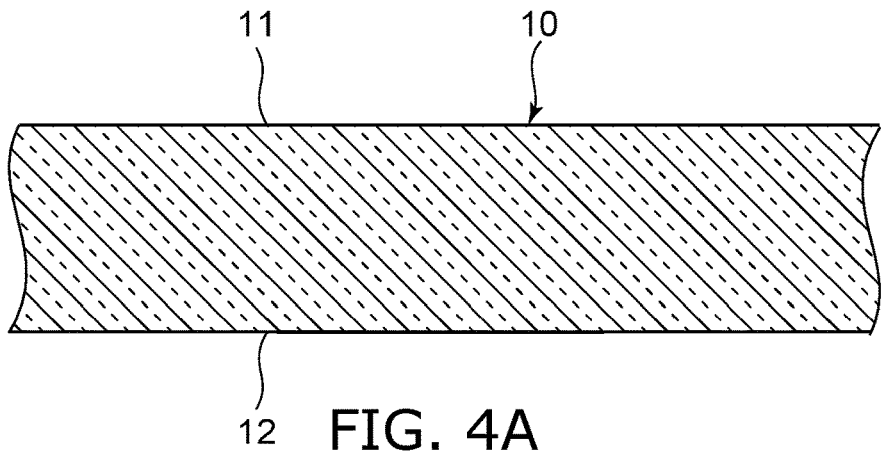
FIG. 4A to FIG. 4G are schematic cross-sectional views showing a method for manufacturing the planar light source of one embodiment of the invention.
Figure 4B:
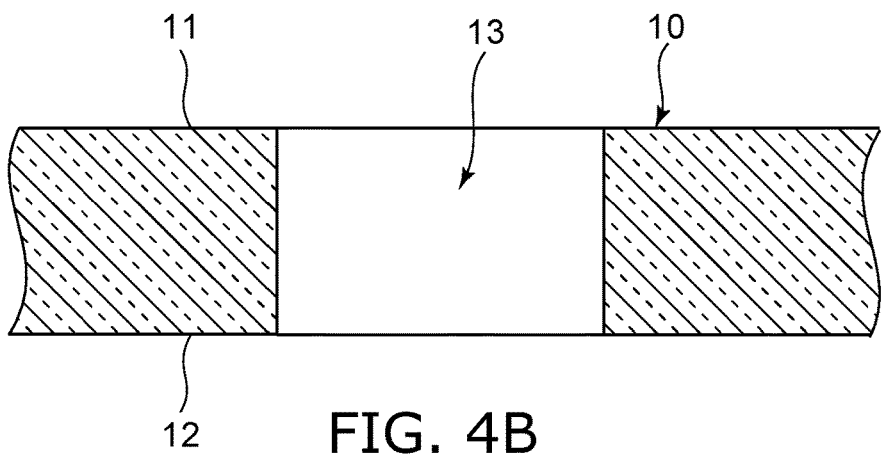
Figure 4C:
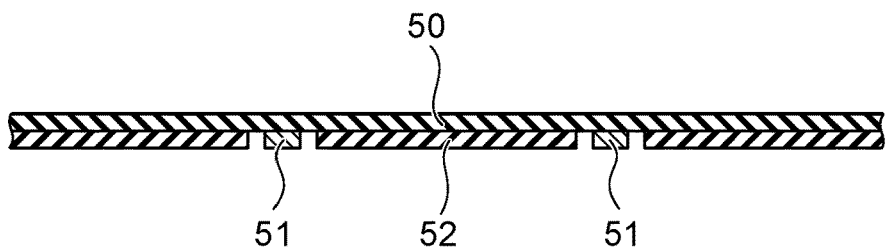
Figure 4D:
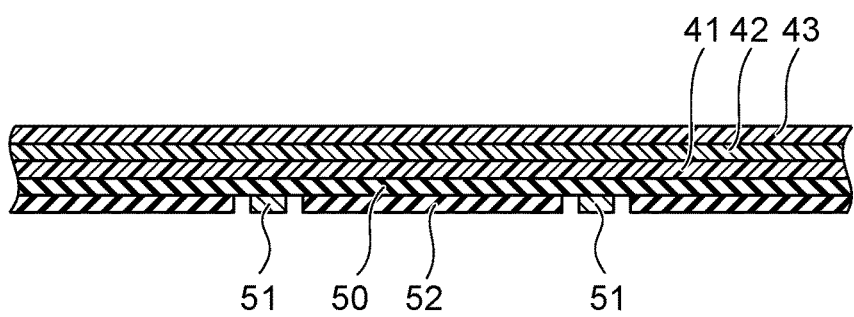
Figure 4E:
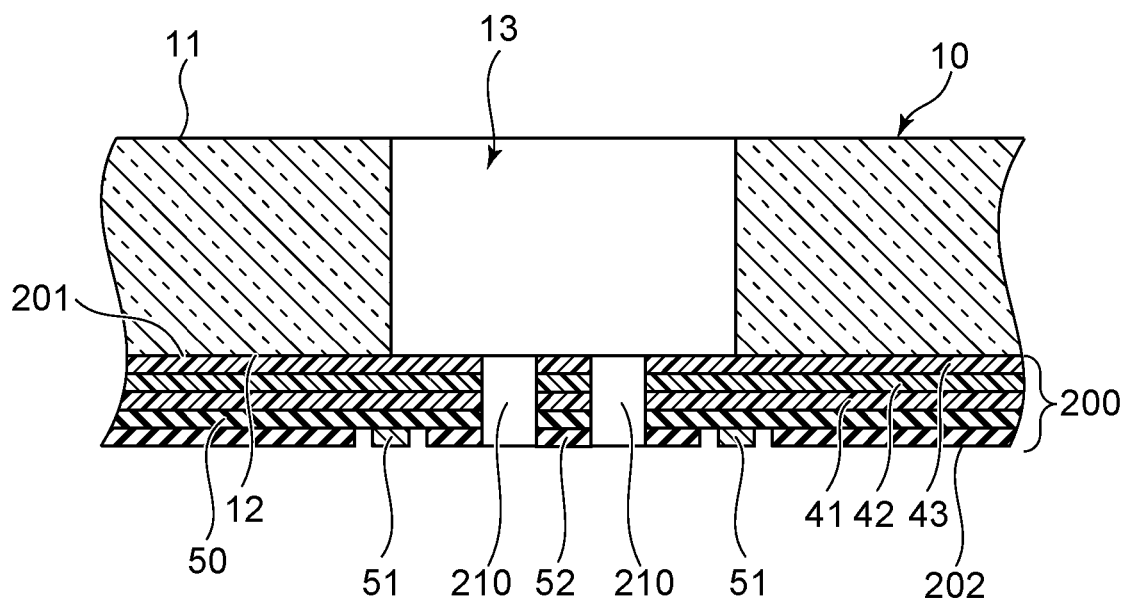
Figure 4F:
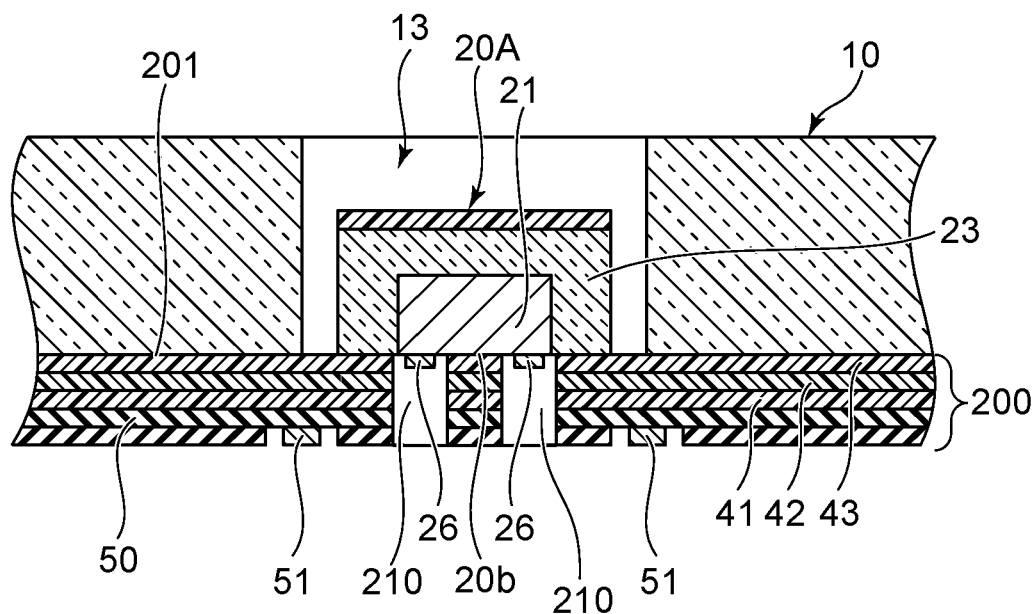
Figure 4G:
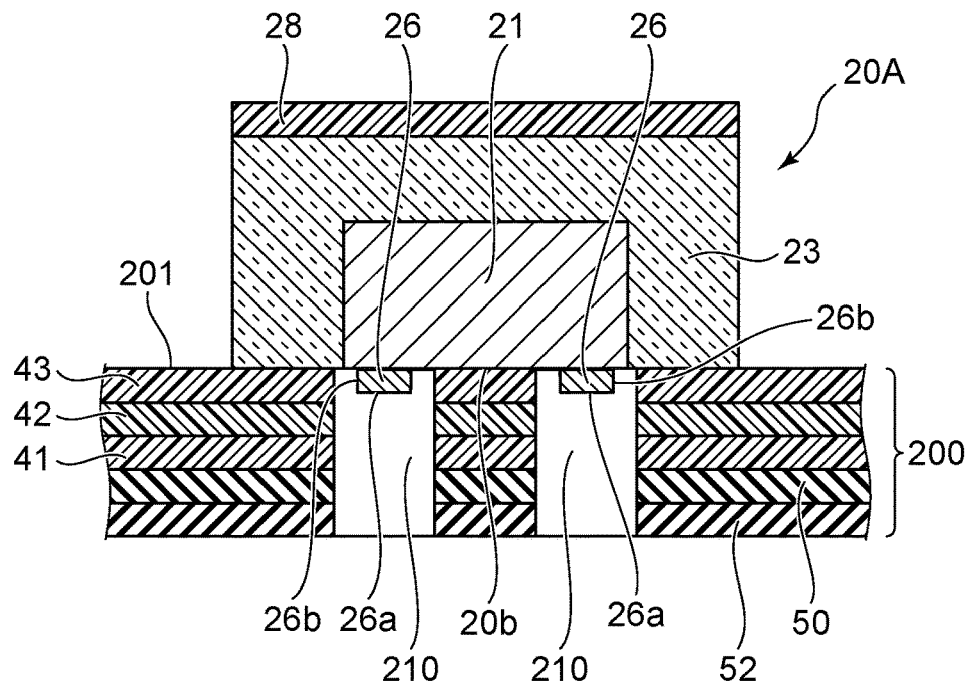
Figure 4H:
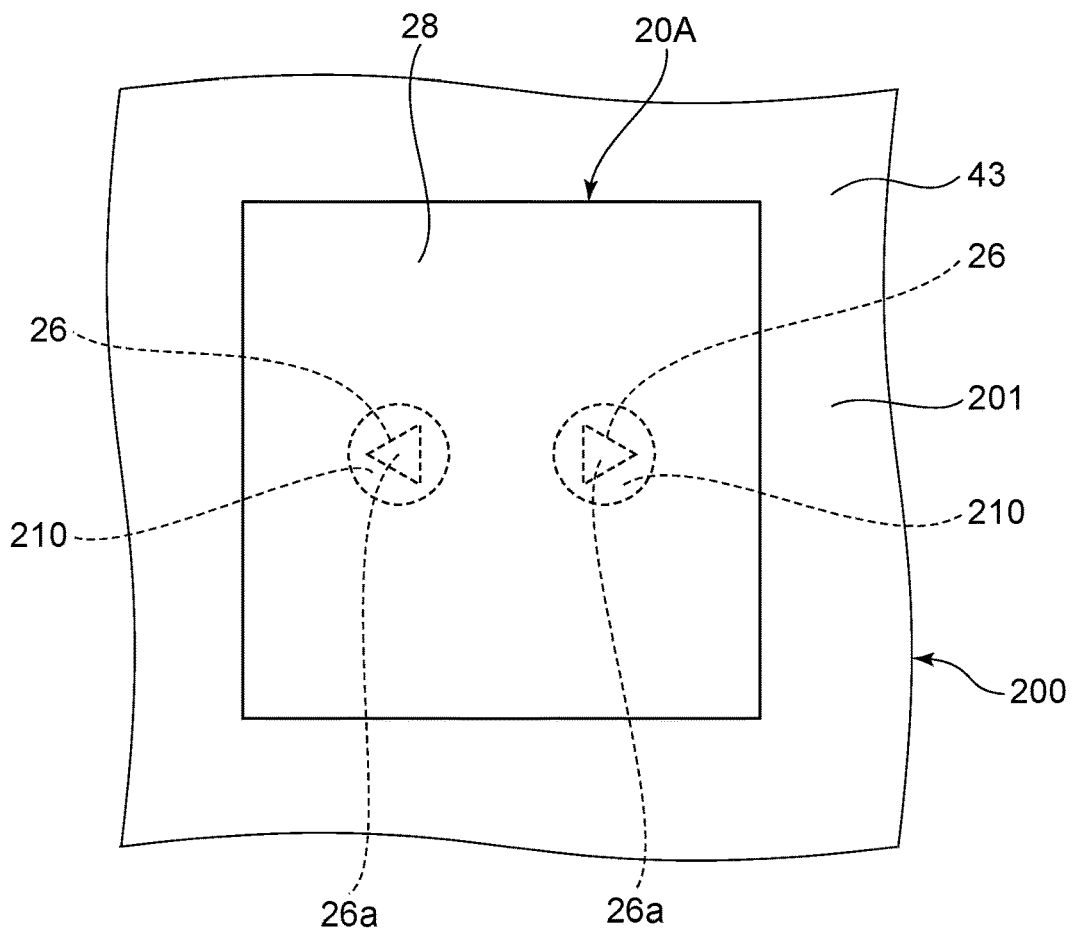
FIG. 4H is a top view illustrating a step illustrated in FIG. 4G.
Figure 4I:
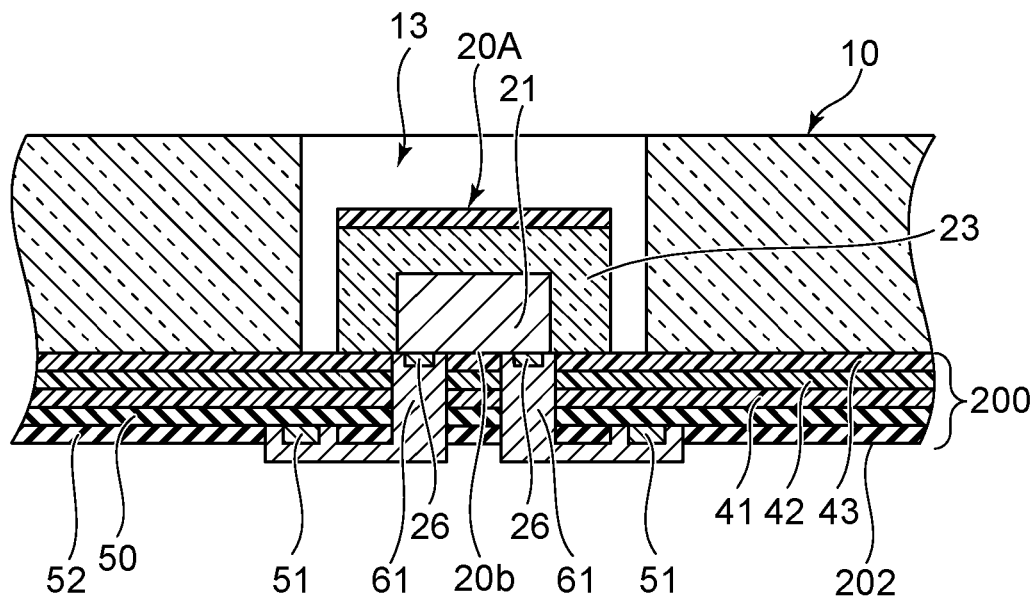
FIG. 4I to FIG. 4N are schematic cross-sectional views showing a method of manufacturing the planar light source of one embodiment of the invention.
Figure 4J:
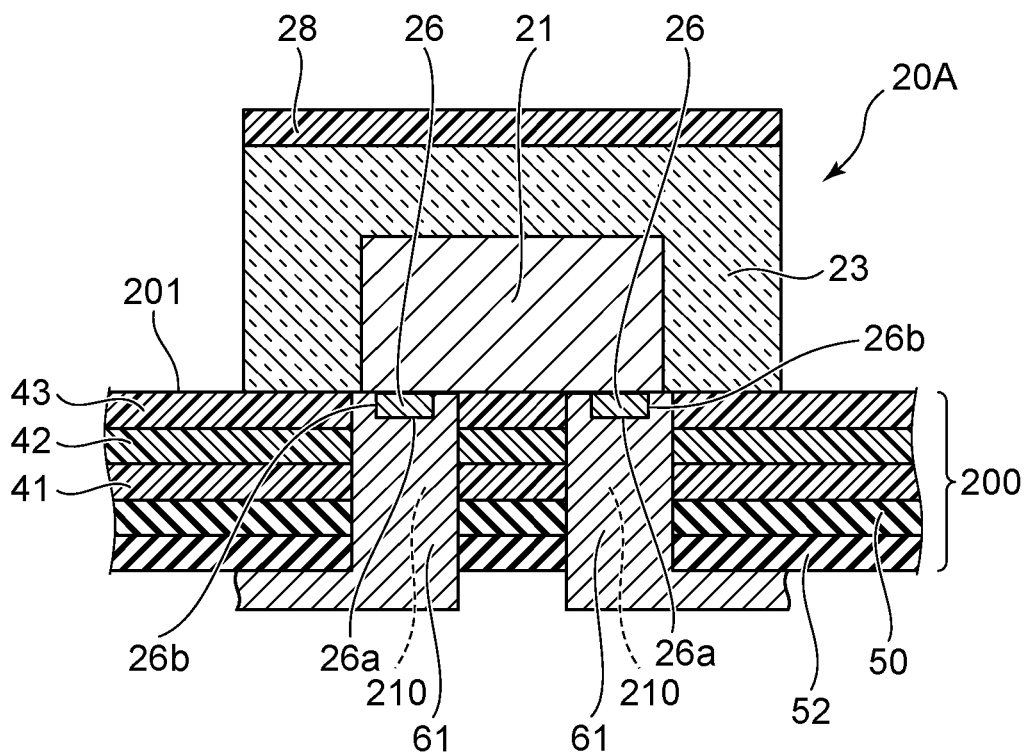

As shown in FIG. 4J to be illustrated below, the lower surface 26a and the lateral surfaces 26b of each electrode 26 of the light source 20A are located in a corresponding first hole 210 below the first upper surface 201 of the support member 200. Each conductive member 61 is in contact with the lower surface 26a and the lateral surfaces 26b of a corresponding electrode 26. Each conductive member 61 electrically connects a corresponding one of the electrodes 26 of the light source 20A and a corresponding connection portion 51 of the wiring layer. Electric power is supplied from an external circuit to the light source 20A via the wiring layer of the wiring substrate 50, the connection portion 51, the conductive member 61, and the electrodes 26.

The lower surface 26a of each electrode 26 of the light source 20A is located in a corresponding first hole 210 below the first upper surface 201 of the support member 200, so that the conductive member 61 located in each first hole 210 is in contact with not only the lower surface 26a but also the lateral surfaces 26b of a corresponding electrode 26. Accordingly, the contact area between each electrode 26 and a corresponding conductive member 61 can be increased, so that the reliability of electrical connection between the light source 20A and the wiring layer can be improved.

Positive and negative conductive members 61 are disposed corresponding to the positive and negative electrodes 26. The conductive member 61 connected to the positive electrode 26 and the conductive member 61 connected to the negative electrode 26 are spaced from each other and are not electrically connected to each other. An insulating film 53 is disposed on the lower surface of the insulating film 52 to cover the conductive member 61. The insulating film 53 is disposed to cover a region between the positive and negative conductive members 61 to increase insulation between the positive and negative conductive members 61.

Next, a method of producing the planar light source 300 will be described with reference to FIGS. 4A to 4N.

The method of producing the planar light source 300 includes a step of providing the light guide member 10 shown in FIG. 4A. The light guide member 10 includes the third upper surface 11 and the third lower surface 12 opposite to the third upper surface 11.

As shown in FIG. 4B, the second hole 13 is formed in the light guide member 10. The second hole 13 is formed as a through-hole that extends through the third upper surface 11 and the third lower surface 12 by using techniques such as drilling, punching, or laser processing. The light guide member 10 defining the second hole 13 may be provided by being purchased.

The method of producing the planar light source 300 further includes a step of providing the support member 200. The step of preparing the support member 200 includes a step of preparing the wiring substrate 50 shown in FIG. 4C. The connection portion 51 of the wiring layer and the insulating film 52 are located on the lower surface of the wiring substrate 50. The connection portion 51 is located in an opening formed in the insulating film 52, and is exposed from the insulating film 52.

As shown in FIG. 4D, the first adhesive member 41, the light-reflective sheet 42, and the second adhesive member 43 are stacked on the upper surface of the wiring substrate 50.

As shown in FIG. 4E, the first holes 210 are formed to extend through the second adhesive member 43, the light-reflective sheet 42, the first adhesive member 41, the wiring substrate 50, and the insulating film 52, so that the support member 200 is obtained. The first holes 210 are formed, for example, by punching, drilling, or laser processing. In a top view, each first hole 210 has, for example, a circular shape. Other examples of a shape of the first holes 210 in a top view include an elliptical shape and a polygonal shape. The support member 200 may be provided by being purchased.

The light guide member 10 is disposed on the support member 200. The third lower surface 12 of the light guide member 10 faces the upper surface of the second adhesive member 43, which forms the first upper surface 201 of the support member 200, and is adhered to the upper surface of the second adhesive member 43.

The first holes 210 formed in the support member 200 are disposed to overlap the second hole 13 formed in the light guide member 10, and are in communication with the second hole 13. In a plan view, two first holes 210 overlap a single second hole 13.

After the light guide member 10 has been disposed on the support member 200, as shown in FIG. 4F, the light source 20A is disposed in the second hole 13 of the light guide member 10. The lower surface 20b of the light source 20A is adhered to the upper surface of the second adhesive member 43, which is exposed in the second hole 13.

FIG. 4G is a schematic enlarged view of a portion in which the light source 20A is disposed on the support member 200 shown in FIG. 4F. FIG. 4H is a top view schematically illustrating a step illustrated in FIG. 4G.

Each of the positive and negative electrodes 26 of the light source 20A is aligned in a corresponding one of the first holes 210. As shown in FIG. 4G, the lower surface 26a and the lateral surfaces 26b of each electrode 26 are located in the corresponding first hole 210 below the first upper surface 201 of the support member 200 (the upper surface of the second adhesive member 43 in this example).

After the light source 20A has been disposed on the support member 200, in the state shown in FIG. 4F, the planar light source 300 is turned upside down. Thereafter, a conductive paste is supplied into the first holes 210 from the first lower surface 202 side of the support member 200. For example, the conductive paste is supplied into the first holes 210 using a technique such as printing or dispensing. As shown in FIG. 4I, the conductive member 61 connected to the electrodes 26 of the light source 20A is formed, for example, by thermally curing the conductive paste supplied into the first holes 210. For example, at this thermal curing, the heating is performed at a temperature in a range of 100° C. to 120° C., and for a period in a range of 0.5 hours to 1 hour. The conductive paste may be supplied into the first holes 210, and the supplied conductive paste may be cured while being subjected to pressurizing at an atmospheric pressure of 5 to 10. When the conductive paste is supplied into the first holes 210 from the first lower surface 202 side of the support member 200, the conductive member 61 is not located in the second hole 13 of the light guide member 10, so that light to be emitted from the light source 20A can be hindered from being absorbed by the conductive member 61.

The conductive paste is also supplied to the first lower surface 202 side of the support member 200, so that the conductive members 61 are formed on the first lower surface 202 side to be connected to respective connection portions 51 of the wiring layer. Therefore, each of the conductive members 61 electrically connects a corresponding one of the electrodes 26 of the light source 20A and a corresponding one of the connection portions 51 of the wiring substrate 50.

FIG. 4J is a schematic enlarged view of a portion in which the light source 20A is disposed on the support member 200 shown in FIG. 4I.

Each conductive member 61 is in contact with the lower surface 26a and the lateral surfaces 26b of a corresponding electrode 26 located in a corresponding first hole 210. In a top view shown in FIG. 4H, the area dimension of each first hole 210 can be in a range of 200% to 500% of the area dimension of each electrode 26 and preferably in a range of 250% to 300% of the area dimension of each electrode 26. With such an area dimension, when the conductive paste is supplied into the first holes 210, generation of voids in the first holes 210 can be reduced, and a sufficient contact area between each electrode 26 and a corresponding conductive member 61 can be secured.

In the present embodiment, each conductive member 61 is in contact with not only the lower surface 26a but also the lateral surfaces 26b of a corresponding electrode 26, so that the contact area between each electrode 26 and a corresponding conductive member 61 can be increased, which allows for improving the reliability of electrical connection between each electrode 26 and a corresponding conductive member 61. In order to obtain the conductive members 61 each in contact with the lateral surfaces 26b of a corresponding electrode 26, when the light source 20A is disposed on the first upper surface 201 of the support member 200, at least a portion of each of the electrodes 26 can protrude with respect to the first upper surface 201 into a corresponding one of the first holes 210.

Also, with the electrodes 26 protruded with respect to the lower surface 20b of the light source 20A into respective first holes 210, the light source 20A disposed on the first upper surface 201 of the support member 200 is less likely to be inclined, so that the orientation of the light source 20A can be stabilized. With increase in the contact area of the conductive paste with the electrode 26, tensile force from the conductive paste having fluidity is exerted to the electrode 26, which causes the light source 20A to be pulled downward, so that the lower surface 20b of the light source 20A can be securely in contact with the first upper surface 201 of the support member 200, so that the light source 20A is less likely to be inclined. In addition, when the light source 20A is disposed on the first upper surface 201 of the support member 200 in a state where one or more of the electrodes 26 are deviated from the first holes 210, the one or more electrodes 26 rides on the first upper surface 201, and the light source 20A is inclined, so that the inclination of the light source 20A can be easily detected by inspection and adjusted.

In order to reduce the inclination of the light source 20A and stabilize the orientation of the light source 20A on the support member 200, it is preferable that the electrodes 26 protrude with respect to the lower surface 20b of the light source 20A into the first holes 210 by 10 µm or more. In the present embodiment, the electrodes 26 protrude with respect to the lower surface 20b of the light source 20A into the first holes 210 by a length of, for example, 55 µm.

Further, in a cross-sectional view shown in FIG. 4J, the lower surface 26a of the electrode 26 is located between the upper surface and the lower surface of the second adhesive member 43 of the support member 200.

It is preferable that, in a top view shown in FIG. 4H, each electrode 26 is located to overlap the centroid (the center of a circle in this example) of the opening shape of a corresponding first hole 210. With a location of the electrode 26 overlapping the centroid of the opening shape of a corresponding first hole 210, an interval between a respective lateral surface 26b of the electrode 26 and a respective lateral surface of the first hole 210 can be secured, and the conductive paste enters a region between a respective the lateral surface 26b of each electrode 26 and a respective lateral surface of a corresponding first hole 210. Accordingly, insufficient contact between the lateral surface 26b of the electrode 26 and the conductive paste is less likely to occur, so that the reliability of electrical connection can be improved.

Figure 4K:
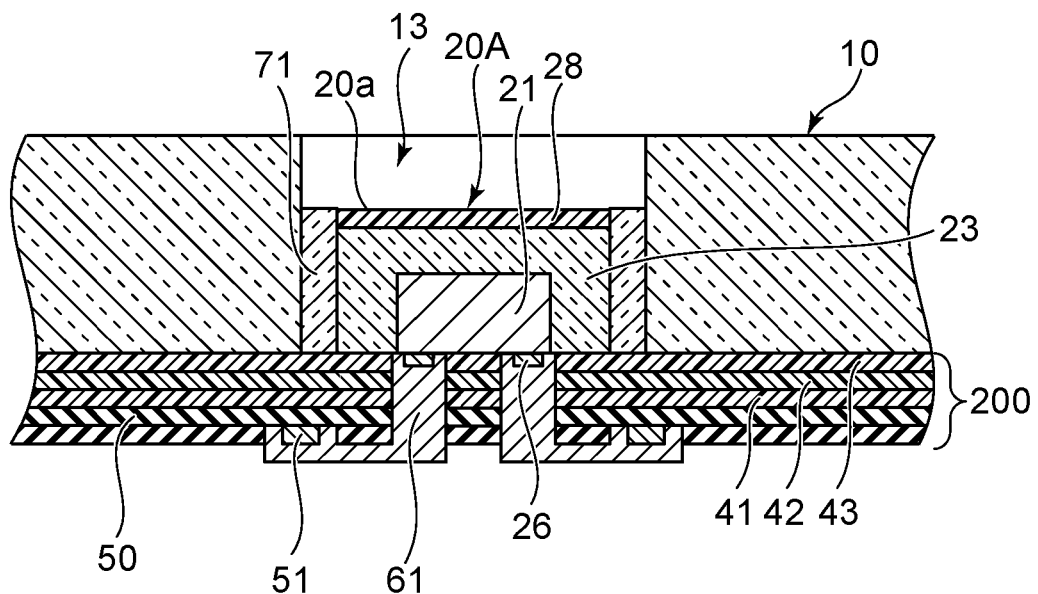

After the conductive member 61 has been formed, as shown in FIG. 4K, the second light-transmissive member 71 is formed in the second hole 13 of the light guide member 10. The second light-transmissive member 71 is disposed between the lateral surface of the light source 20A and the lateral surface of the second hole 13. The upper surface 20a of the light source 20A is exposed from the second light-transmissive member 71. The second light-transmissive member 71 is formed, for example, by supplying a liquid light-transmissive resin into the second hole portion 13 and then heating to cure the liquid light-transmissive resin. For example, the heating is performed at a temperature in a range of 100° C. to 120° C., and for a period in a range of 0.5 hours to 1 hour. The light source 20A is secured to the light guide member 10 by the second light-transmissive member 71.

Figure 4L:
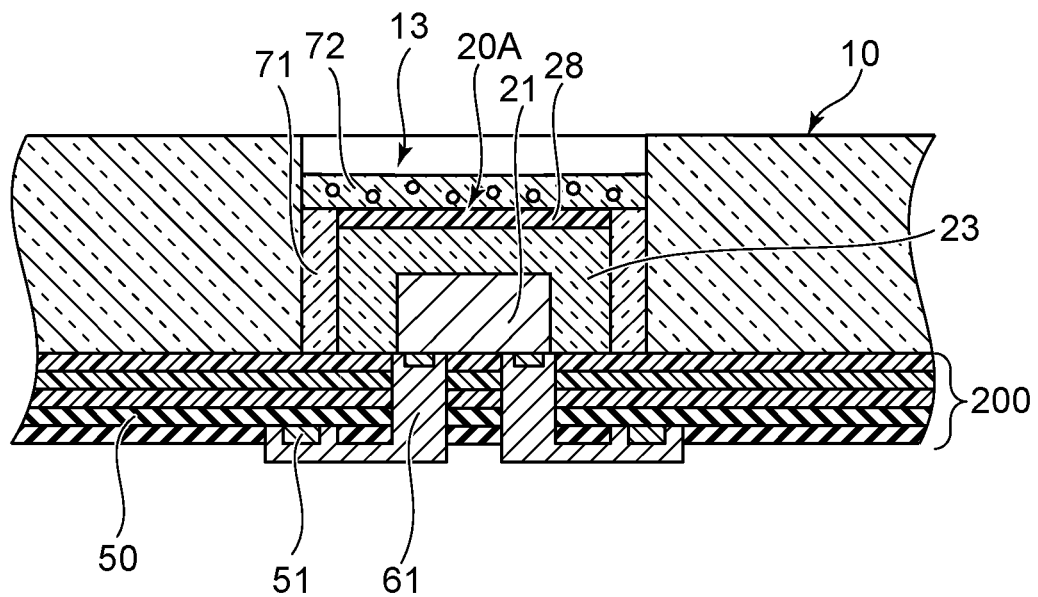

After the second light-transmissive member 71 has been formed, as shown in FIG. 4L, the wavelength conversion member 72 is formed on the light source 20A and the second light-transmissive member 71 in the second hole 13. The wavelength conversion member 72 is formed, for example, by supplying a liquid resin containing a phosphor into the second hole 13 and then thermally curing the liquid resin. For example, the heating is performed at a temperature in a range of 80° C. to 120° C., and for a period in a range of 5 minutes to 30 minutes.

Figure 4M:
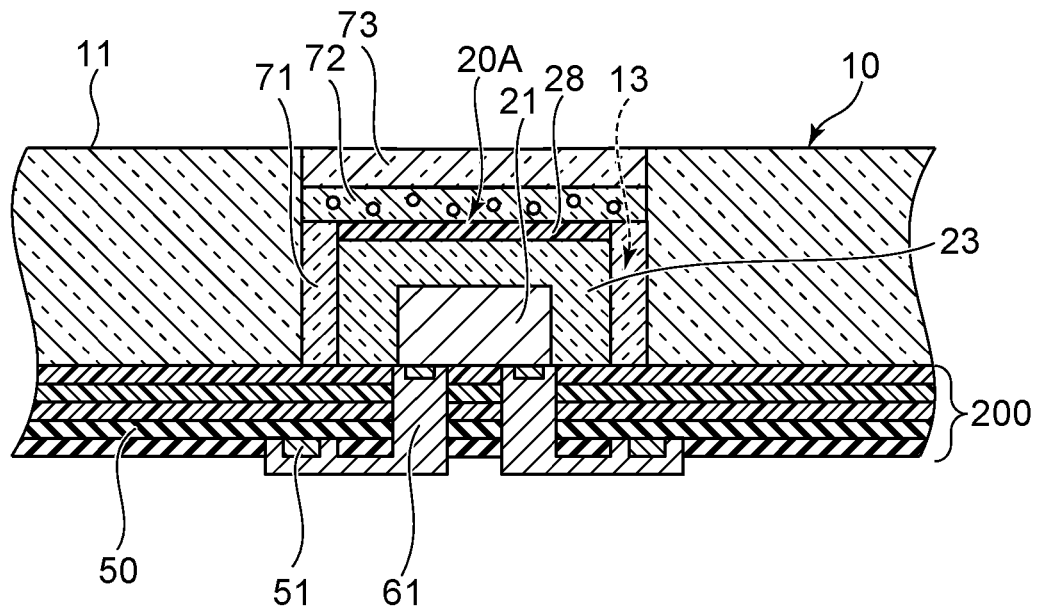

After the wavelength conversion member 72 has been formed, as shown in FIG. 4M, the third light-transmissive member 73 is formed on the wavelength conversion member 72 in the second hole 13. The third light-transmissive member 73 is formed, for example, by supplying a liquid resin onto the wavelength conversion member 72 and then thermally curing the liquid resin. For example, the heating is performed at a temperature in a range of 80° C. to 120° C., and for a period in a range of 5 minutes to 30 minutes.

Figure 4N:
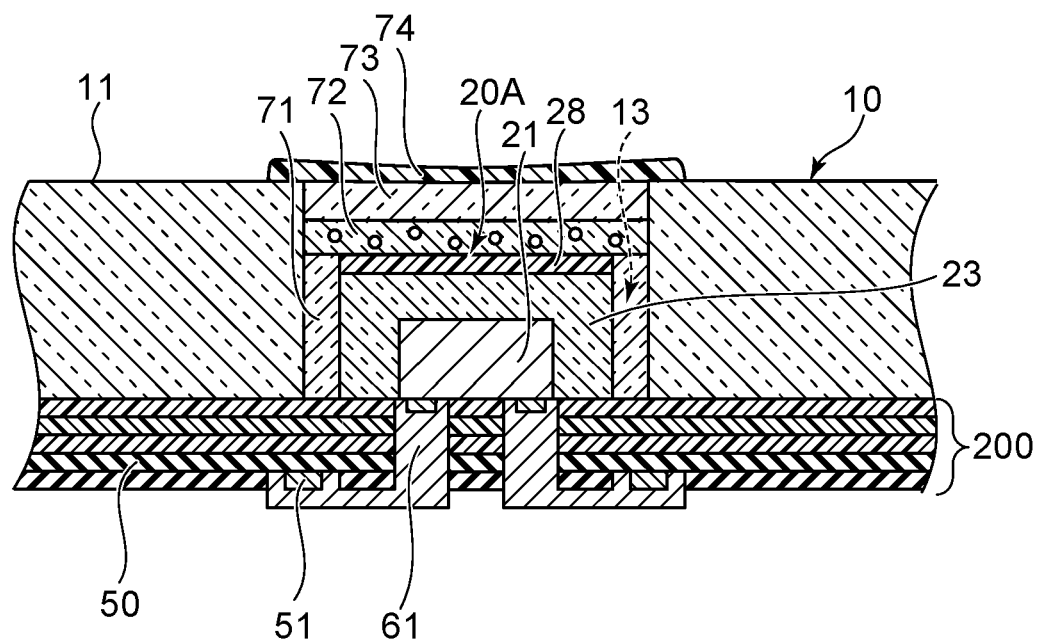

After the third light-transmissive member 73 has been formed, as shown in FIG. 4N, the second light adjustment member 74 is formed on the third light-transmissive member 73. The second light adjustment member 74 is formed, for example, by supplying a liquid resin containing a light diffusing agent onto the third light-transmissive member 73 and then thermally curing the liquid resin. For example, the heating is performed at a temperature in a range of 80° C. to 120° C., and for a period in a range of 5 minutes to 30 minutes.

After the second light adjustment member 74 has been formed, as shown in FIG. 2, the insulating film 53 is formed on the first lower surface 202 of the support member 200 to cover the conductive members 61. For example, the insulating film 53 is formed using a technique such as printing, potting, spraying, inkjetting, or the lamination of a resin sheet.

The method of producing the planar light source 300 has been described above, but the order of operations is not limited to those in the description above. For example, after the light source 20A is disposed on the support member 200, the light guide member 10 may be disposed around the light source 20A. Alternatively, for example, after the light source 20A is disposed on the support member 200 and the second light-transmissive member 71 is formed in the second hole 13 of the light guide member 10, a conductive paste may be supplied into the first holes 210. The second light-transmissive member 71, the wavelength conversion member 72, and the third light-transmissive member 73 are formed in the second hole 13; however, the invention is not limited thereto. Multiple layers may be further formed in the second hole 13, or only the light-transmissive member or the wavelength conversion member of a single layer may be formed.

Figure 5:
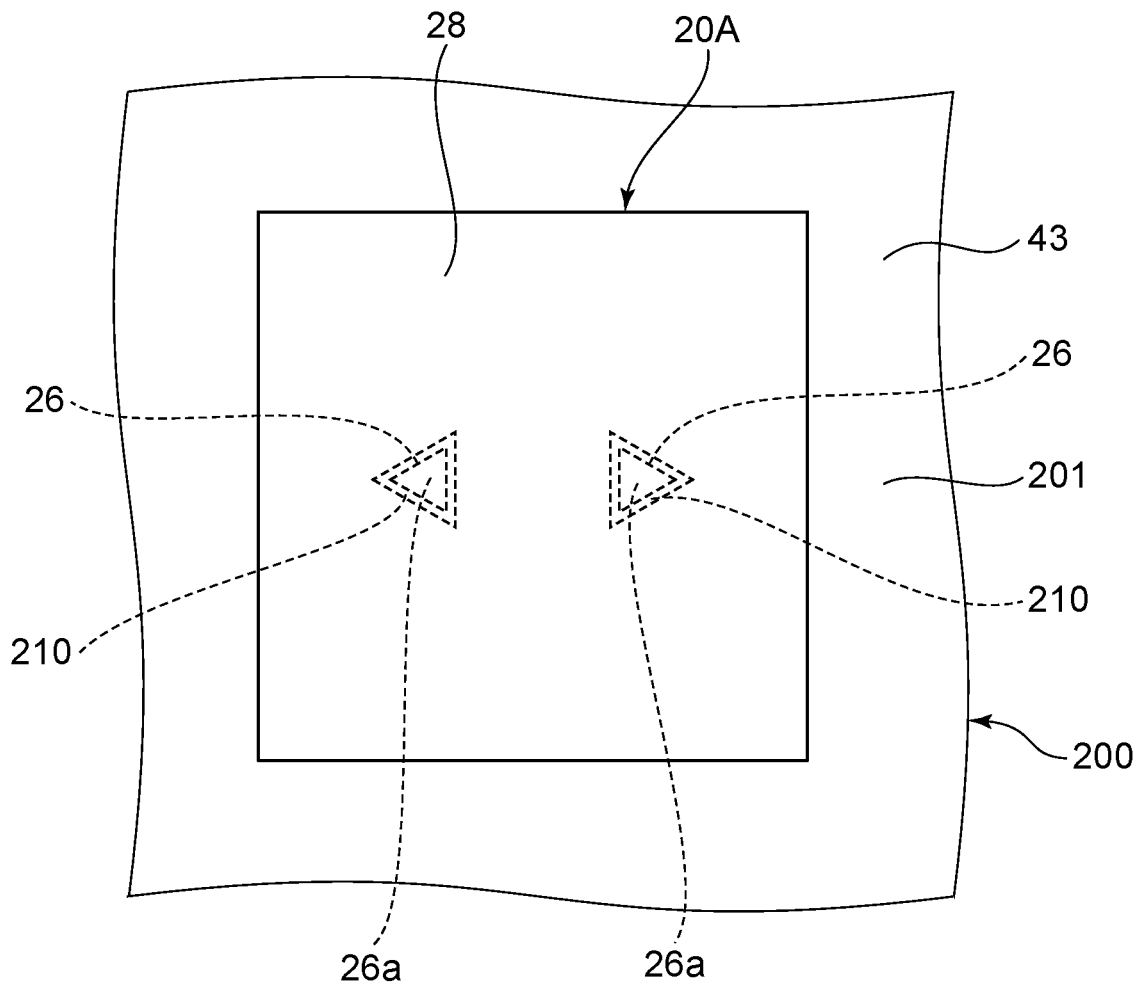
FIG. 5 is a schematic top view similar to FIG. 4H according to a modification example.

FIG. 5 is a top view of FIG. 4G similar to FIG. 4H according to a modification example.

In the top view, each first hole 210 and each electrode 26 of the light source 20A are similar in shape. The expression "being similar in shape" is not limited to the relationship of mathematically exact similarity, and "being similar in shape" also includes a relationship in which when one is enlarged or reduced, the shape of the one does not exactly coincide with the shape of the other and there is a slight deviation therebetween.

In the example shown in FIG. 5, in a top view, each first hole 210 and each electrode 26 have respective triangular shapes including the same number of corners (three corners), and the corresponding corners face each other. Alternatively, in a top view, the first hole 210 and the electrode 26 may have a circular shape. Alternatively, in a top view, the first hole 210 and the electrode 26 may have respective quadrilateral or higher polygonal shapes including the same number of corners, and may be in a relationship in which the corresponding corners face each other.

In a top view, when the shape of the first hole 210 is similar to the shape of the electrode 26, the size of the first hole 210 can be further reduced than when the shapes of the first hole 210 the electrode 26 are not similar. As used herein, the "size of the first hole 210" refers to a size in a direction orthogonal to a depth direction of the first hole 210 (diameter or a size in a width direction). When the shape of the first hole 210 and the shape of the electrode 26 are similar, it is preferable that in a top view, the area of the first hole 210 is 150% to 300% of the area of the electrode 26.

When the size of the first hole 210 is reduced, the area of the light-reflective sheet 42 that extends below the light source 20A is widened accordingly, thus leading to an improvement in brightness. In addition, when the size of the first hole 210 is reduced, the interval between the positive and negative conductive members 61 that are connected to the positive and negative electrodes 26, respectively, can be widened, and a short circuit between the positive and negative conductive members 61 is prevented, so that insulation can be improved.

Figure 6A:
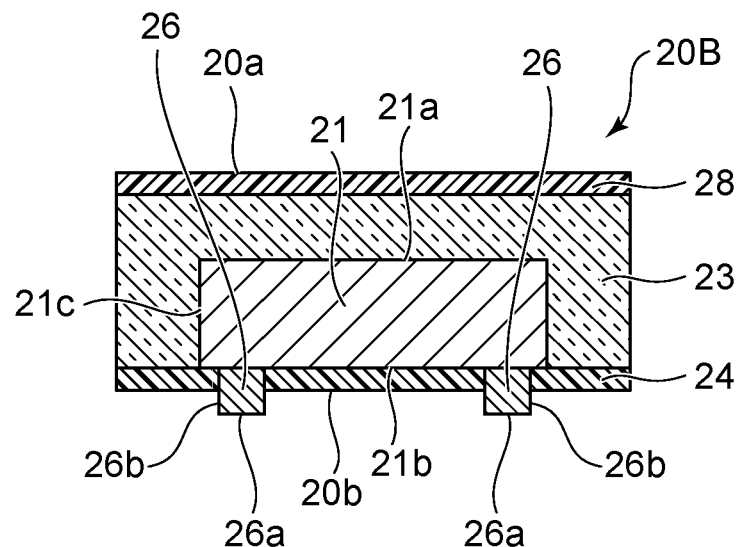
FIG. 6A is a schematic cross-sectional view of a light source of another embodiment of the invention.

FIG. 6A is a cross-sectional view of a light source 20B of another embodiment of the invention.

In the light source 20B, a covering member 24 is disposed on the second lower surface 21b of the light-emitting element 21 to cover the second lower surface 21b of the light-emitting element 21. In addition, the covering member 24 is also disposed on the lower surface of the first light-transmissive member 23 to cover the lower surface of the first light-transmissive member 23. A lower surface of the covering member 24 forms the lower surface 20b of the light source 20B, which is adhered to the upper surface of the second adhesive member 43 of the support member 200. The lower surface 26a and the lateral surfaces 26b of the electrode 26 disposed on the second lower surface 21b of the light-emitting element 21 are exposed from the covering member 24.

To expose the lower surface 26a and the lateral surface 26b of the electrode 26, which is disposed on the second lower surface 21b of the light-emitting element 21, from the covering member 24, the electrode 26 is entirely embedded with the covering member 24. Thereafter, the covering member 24 is removed by irradiating with laser light, so that the lower surface 26a and a portion of the lateral surface 26b of the electrode 26 are exposed. In the removal using laser light, a speed of removing the covering member 24 which is, for example, a resin is higher than a speed of removing the electrode 26 which is metal. Accordingly, when the entirety of the lower surface of the covering member 24 is irradiated with laser light, the lower surface 26a and a portion of the lateral surface 26b of the electrode 26 can be exposed from the covering member 24. Such removal of the covering member 24 using laser light causes formation of protrusions and recesses in the lower surface of the covering member 24.

The covering member 24 is reflective to light to be emitted from the light-emitting element 21. When the first light-transmissive member 23 contains a phosphor, the covering member 24 is also reflective to light to be emitted by the phosphor. The covering member 24 is a silicone resin, a phenol resin, an epoxy resin, or an acrylic resin containing a light diffusing agent formed of particles made of, for example, $TiO_2$, $SiO_2$, $Al_2O_3$, ZnO, glass, or the like.

Figure 6B:
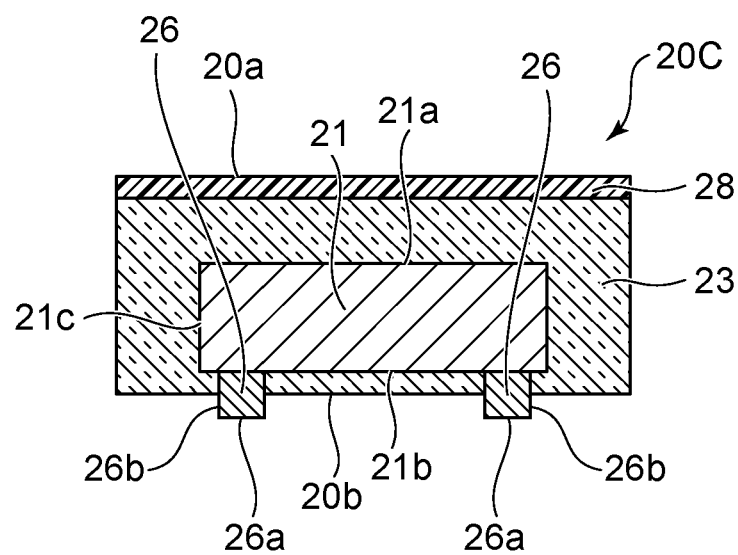
FIG. 6B is a schematic cross-sectional view of a light source of further another embodiment of the invention.

FIG. 6B is a schematic cross-sectional view of a light source 20C of further another embodiment of the invention.

In the light source 20C, the first light-transmissive member 23 covers the second lower surface 21b of the light-emitting element 21. The lower surface of the first light-transmissive member 23 forms the lower surface 20b of the light source 20C, which adheres to the upper surface of the second adhesive member 43 of the support member 200. The lower surface 26a and the lateral surfaces 26b of the electrode 26 are exposed from the first light-transmissive member 23.

Each of the light source 20B shown in FIG. 6A and the light source 20C shown in FIG. 6B is disposed on the support member 200 in the second hole 13 of the light guide member 10 described above, the lower surface 26a and the lateral surface 26b of each electrode 26 are located in a corresponding first hole 210 of the support member 200, and each conductive member 61 is in contact with the lower surface 26a and the lateral surface 26b of a corresponding electrode 26. Instead of configurations shown in FIGS. 6A, 6B, etc., the light source 20 may have a configuration including the light-emitting element 21 but not including the first light-transmissive member 23, the covering member 24, the first light adjustment member 28, and the like.

The second hole formed in the light guide member 10 is not necessarily a through-hole, and may be a recess that is open to the third lower surface 12 side. In this case, each of the light sources 20A to 20C is disposed in the recess.

What is claimed is:

1. A planar light source comprising:
a support member having an upper surface and a lower surface opposite the upper surface, wherein the support member defines a plurality of first holes extending from the upper surface to the lower surface, and wherein the support member comprises a wiring layer disposed at a lower surface side;
a light source disposed on the upper surface of the support member, the light source comprising:
a light-emitting element having an upper surface and a lower surface opposite the upper surface, and
a plurality of electrodes disposed on the lower surface of the light-emitting element; and
a plurality of conductive members, each of which is disposed in a corresponding one of the first holes and electrically connects a corresponding one of the electrodes and the wiring layer, wherein:
a lower surface of each of the electrodes is located in the corresponding first hole, and
each of the conductive members is in contact with the lower surface and lateral surfaces of the corresponding electrode.

2. The planar light source according to claim 1, wherein the support member includes an adhesive member, and an upper surface of the adhesive member forms the upper surface of the support member, and a lower surface of the light source is in contact with the upper surface of the adhesive member.

3. The planar light source according to claim 1, wherein in a top view, each of the electrodes is located to overlap a centroid of an opening shape of the first hole.

4. The planar light source according to claim 2, wherein in a top view, each of the electrodes is located to overlap a centroid of an opening shape of the first hole.

5. The planar light source according to claim 1, further comprising:
a light guide member having an upper surface, a lower surface opposite the upper surface, and a second hole in which the light source is disposed, wherein the light guide member is disposed on the support member with the lower surface of the light guide member facing the upper surface of the support member.

6. The planar light source according to claim 2, further comprising:
a light guide member having an upper surface, a lower surface opposite the upper surface, and a second hole in which the light source is disposed, wherein the light guide member is disposed on the support member with the lower surface of the light guide member facing the upper surface of the support member.

7. The planar light source according to claim 3, further comprising:
a light guide member having an upper surface, a lower surface opposite the upper surface, and a second hole in which the light source is disposed, wherein the light guide member is disposed on the support member with the lower surface of the light guide member facing the upper surface of the support member.

8. The planar light source according to claim 4, further comprising:
a light guide member having an upper surface, a lower surface opposite the upper surface, and a second hole in which the light source is disposed, wherein the light guide member is disposed on the support member with the lower surface of the light guide member facing the upper surface of the support member.

9. The planar light source according to claim 5,
wherein the support member comprises:
a wiring substrate comprising the wiring layer, and
a light-reflective sheet disposed between the wiring substrate and the lower surface of the light guide member, and between the wiring substrate and the light source.

10. The planar light source according to claim 6,
wherein the support member comprises:
a wiring substrate comprising the wiring layer, and
a light-reflective sheet disposed between the wiring substrate and the lower surface of the light guide member, and between the wiring substrate and the light source.

11. The planar light source according to claim 7,
wherein the support member comprises:
a wiring substrate comprising the wiring layer, and
a light-reflective sheet disposed between the wiring substrate and the lower surface of the light guide member, and between the wiring substrate and the light source.

12. The planar light source according to claim 8,
wherein the support member comprises:
a wiring substrate comprising the wiring layer, and
a light-reflective sheet disposed between the wiring substrate and the lower surface of the light guide member, and between the wiring substrate and the light source.

13. The planar light source according to claim 1,
wherein in a top view, each of the first holes and each of the electrodes are similar in shape.

14. The planar light source according to claim 1,
wherein in a top view, each of the first hole portions and each of the electrodes have a circular shape.

15. The planar light source according to claim 1,
wherein in a top view, each of the first holes and each of the electrodes have respective polygonal shapes including a same number of corners, and corresponding ones of the corners face each other.

16. The planar light source according to claim 2,
wherein, in a cross-sectional view, the lower surface of the electrode is located between the upper surface and a lower surface of the adhesive member of the support member.

17. The planar light source according to claim 4,
wherein, in a cross-sectional view, the lower surface of the electrode is located between the upper surface and a lower surface of the adhesive member of the support member.

* * * * *